United States Patent
Gopal et al.

(10) Patent No.: US 11,768,224 B2
(45) Date of Patent: Sep. 26, 2023

(54) TEST AND BURN-IN APPARATUS THAT PROVIDES VARIABLE THERMAL RESISTANCE

(71) Applicant: KES SYSTEMS, INC., Tempe, AZ (US)

(72) Inventors: Ballson Gopal, Tempe, AZ (US); Jesse Killion, Atlanta, GA (US)

(73) Assignee: KES SYSTEMS, INC., Tempe, AZ (US)

( * ) Notice: Subject to any disclaimer, the term of this patent is extended or adjusted under 35 U.S.C. 154(b) by 132 days.

(21) Appl. No.: 17/424,669

(22) PCT Filed: Jan. 28, 2020

(86) PCT No.: PCT/US2020/015359
§ 371 (c)(1),
(2) Date: Jul. 21, 2021

(87) PCT Pub. No.: WO2020/159954
PCT Pub. Date: Aug. 6, 2020

(65) Prior Publication Data
US 2022/0082587 A1 Mar. 17, 2022

Related U.S. Application Data

(60) Provisional application No. 62/798,117, filed on Jan. 29, 2019.

(51) Int. Cl.
*G01R 31/28* (2006.01)
*G01R 1/04* (2006.01)

(52) U.S. Cl.
CPC ....... *G01R 1/0458* (2013.01); *G01R 31/2875* (2013.01)

(58) Field of Classification Search
CPC ............ G01R 31/2856; G01R 31/2875; G01R 31/2877
See application file for complete search history.

(56) References Cited

U.S. PATENT DOCUMENTS 5,821,505 A    10/1998   Tustaniwskyj et al.
6,184,504 B1    2/2001   Cardella
(Continued)

FOREIGN PATENT DOCUMENTS

EP         3190423 A1    7/2017

OTHER PUBLICATIONS

International Search Report and Written Opinion for Application No. PCT/US20/15359 dated Apr. 6, 2020, 7 pp.
(Continued)

*Primary Examiner* — Tung X Nguyen
(74) *Attorney, Agent, or Firm* — Botos Churchill IP Law LLP

(57) ABSTRACT

A system and method introduce a variable thermal resistance to test and burn in apparatus. The system and method provide an efficient design for more accurate temperature control of integrated circuits. A system for testing integrated circuit (IC) packages comprises a plurality of IC testing socket bases arranged on a testing board and configured to receive a plurality of IC packages. A plurality of IC testing socket lids are arranged to attach to the testing board. Each IC testing socket lid comprises a temperature sensor to thermally contact the IC package and measure a surface temperature of the IC package, a heat sink is placed into either proximity to or directly in contact with the IC package, and an electronic controller to receive signals from the temperature sensor. A variable thermal resistance is introduced in the thermal conductive pathway formed from the device under test (DUT), the DUT contact and the heat sink (Continued)

such that the heat introduced into the system can be controlled and the adverse effects of unwanted cooling can be mitigated.

22 Claims, 14 Drawing Sheets

(56) References Cited

U.S. PATENT DOCUMENTS

| | | | |
|---|---|---|---|
| 6,501,290 B2* | 12/2002 | Kvanvig | G01R 31/2875 |
| | | | 324/750.19 |
| 7,650,762 B2 | 1/2010 | Hamilton et al. | |
| 8,628,240 B2 | 1/2014 | Tustaniwskyj et al. | |
| 2006/0186909 A1* | 8/2006 | Aube | G01R 31/2875 |
| | | | 324/750.09 |
| 2006/0290370 A1 | 12/2006 | Lopez | |
| 2007/0296434 A1 | 12/2007 | Yamada et al. | |
| 2009/0009204 A1 | 1/2009 | Lee et al. | |
| 2015/0276798 A1 | 10/2015 | Song et al. | |

OTHER PUBLICATIONS

Extended European Search Report issued in corresponding EP Patent Application No. 20748086.4, dated Oct. 5, 2022, (10 pages).
Singaporean Office Action issued in corresponding SG Patent Application No. 11202107945Q, dated Feb. 8, 2023, (8 pages).

* cited by examiner

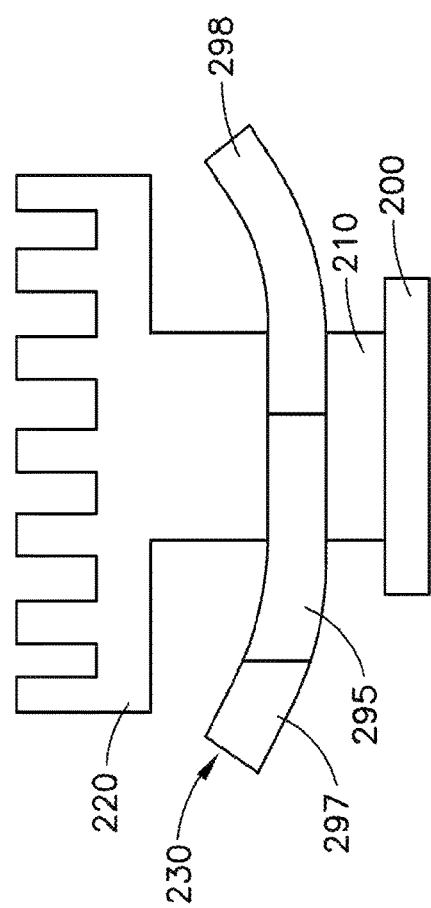

TEST AND BURN-IN APPARATUS THAT PROVIDES VARIABLE THERMAL RESISTANCE

CROSS REFERENCE TO RELATED APPLICATIONS

The present application is a national phase entry under 35 U.S.C. § 371 of International Application No. PCT/US20/15359 filed Jan. 28, 2020, published in English, which claims the benefit of U.S. Application No. 62/798,117 filed Jan. 29, 2019, the disclosure of which is hereby incorporated herein by reference.

TECHNICAL FIELD

This invention relates to integrated circuit testing sockets and, more particularly, to temperature control of integrated circuits in an integrated circuit testing and/or burn-in socket.

BACKGROUND

Conventional burn-in temperature controllers for moderate and low power devices comprise a heater and heat sink touching the top of the device under test (DUT). Constant air flow through the chamber across the heat sink provides cooling. One such configuration is illustrated in US Patent Publication No. 2006/0290370 to Lopez, which is hereby incorporated by reference. The problem with the design described in Lopez is that, for a given set of temperature controllers, the heat sink geometry is fixed. The chamber air temperature may be raised to reduce cooling, however, the extent of any such increase in air temperature is limited by the highest-power device in the lot and/or the worst thermal contact to a DUT in the chamber. Raising the chamber air temperature beyond this limit would cause at least one DUT to overheat and require the test and burn-in apparatus to shut down. In addition, changes in device power during the test require some margin for additional cooling or heating on short notice. Therefore, the chamber air is maintained at a condition that allows for excess cooling capacity for all DUTs in all test conditions. Under these circumstances, the DUT will reach the desired temperature only with the addition of heat provided by a resistance heater embedded in the temperature controller. This supplemental heating may be of similar or greater magnitude as the DUT power dissipation itself creates a power requirement for burn-in test that is significantly higher than what would be required just to power the DUTs.

U.S. Pat. No. 8,628,240 to Tustaniwiskyj et al. describes a device that has a temperature sensor for measuring the temperature of electronic devices. The temperature sensor allows for better control of the device temperature by direct feedback to a system that adjusts device temperature. In one example, the temperature signal is used to maintain device temperature at or near a desired set point temperature during operation or testing of the device. Although Tustaniwiskyj et al. recognizes the value of controlling the temperature of DUTs individually, improved apparatus that allow for independent temperature control of each DUT in an array of DUTs continue to be sought.

BRIEF SUMMARY

Described herein is a system having a thermal system that has an air chamber in thermal communication with a burn in board. There is a thermal resistance between the air chamber and the burn-in board. The burn in board has a socket in which to receive a device under test (DUT). The device package is disposed in the socket. The device package has an electronic device therein and the electronic device is disposed in a device package. There is a thermal resistance between the device package and the burn-in board. The system also has a temperature controller having a heater and a heat sink, the temperature controller in thermal communication with the device package. There is a first thermal resistance between the temperature controller and the device package and there is also a thermal resistance between the heater and the heat sink. The thermal resistance between the heater and the heat sink is a variable thermal resistance and can be adjusted based on a thermal profile of the system. The temperature controller is also in thermal communication with the air chamber, wherein there is a thermal resistance between the temperature controller and the air chamber.

Described herein is a system having a thermal system having an air chamber in thermal communication with a burn-in board. There is a thermal resistance between the air chamber and the burn-in board. The burn-in board has at least one socket in which to receive a device under test (DUT). The system receives a device package disposed in the socket. The device package has an electronic device. The electronic device is disposed in the device package and there is a thermal resistance between the device package and the burn-in board. The system also has a temperature controller having a heater and a heat sink. The temperature controller is thermally connected to the device package. There is a first thermal resistance between the temperature controller and the device package. There is also a thermal resistance between the heater and the heat sink. The thermal resistance between the heater and the heat sink is a variable thermal resistance. The temperature controller is also in thermal communication with the air chamber, wherein there is a thermal resistance between the temperature controller and the air chamber.

Typically, the variable thermal resistance allows the thermal resistance between the heater and the heat sink to be varied. In one example, the variable thermal resistance is placed between opposing surfaces of the heat sink and a contact element on the device package and the variable thermal resistance is provided by a variable resistance material selected from the group consisting of a gallium material or a phase change material. In one embodiment, the phase change material is a solid at room temperature and softens and flows at or above a transition temperature that is above room temperature.

In another embodiment a distance between the heat sink and the contact element on the device package is variable, and a surface area and length of the variable resistance material changes as the distance between the heat sink and the device package changes. In one embodiment at least one of the opposing surfaces of the heat sink and the contact element is a contoured surface such that the distance between the opposing surfaces of the heat sink and the contact element is varied due to the contoured surface. In a further embodiment, both opposing surface are contoured and both contours are complementary to each other.

In another embodiment the variable thermal resistance is placed between the heat sink and a contact element on the device package and the variable thermal resistance is provided by a variable resistance material that is a shaped conductive elastomer material. One example of such a material is impregnated silicone.

In another embodiment wherein the distance between the heat sink and the device package is variable, a surface area and length of the variable resistance material changes as the distance between the heat sink and the device package changes.

In yet another embodiment the variable thermal resistance is placed between the heat sink and a contact element on the device package and the variable thermal resistance is provided by a moveable conductor element. For example, the moveable conductor element varies a thermal contact area between the heat sink and the contact element has at least two raised contact surfaces. A surface area of a first raised contact surface is different than a surface area of a second raised contact surface and the moveable conductor element has a first position wherein the first raised contact surface is interposed between the heat sink and the contact element and a second position wherein the second raised contact surface is interposed between the heat sink and the contact element. In yet another example, the moveable conductor element has a conductor element with variable dimensions and the moveable conductor element varies the thermal resistance by moving the moveable conductor element to adjust an amount of surface area of the conductor element in contact with the heat sink and the conductor element.

In another embodiment the variable thermal resistance is placed between opposing surfaces of the heat sink and a contact element on the device package and the variable thermal resistance is provided by a liquid material, wherein the liquid material is retained in a thermally conductive container. In this example, a boiling point of the liquid material is about 25° C. to about 150° C. and a thermal conductivity of the liquid material is about 0.1 watt/meter ° K to about 0.2 watt/meter ° K. Further, the liquid material has conductive rods disposed therein.

In another embodiment, the variable thermal resistance is placed between opposing surfaces of the heat sink and a contact element on the device package and the variable thermal resistance is provided by a sectioned variable thermal resistance comprising at least two sections, a gas section a liquid section, wherein adjusting a pressure in the gas section moves more or less of a liquid in the liquid section into a thermally conductive path between the heat sink and the contact element.

In another embodiment, the variable thermal resistance is the heat sink having a variable number of fins or sections such that a surface area of the heat sink is adjustable. For example, the variable thermal resistance is provided by an adjustable distance between opposing surfaces of the heat sink and a contact element on the device package.

In yet another example, the variable thermal resistance is provided by a container placed between opposing surfaces of the heat sink and a contact element on the device package. The container receives a liquid spray, wherein a thermal conductivity between the contact element and the heat sink varies with a quantity and a temperature of the liquid. In yet another example, the variable thermal resistance is provided by a closed fluid loop placed between opposing surfaces of the heat sink and a contact element on the device package. In a further embodiment, the variable thermal resistance is provided by a thermoelectric element placed between opposing surfaces of the heat sink and a contact element on the device package.

BRIEF DESCRIPTION OF DRAWINGS

FIG. 11 illustrates one embodiment having a fixed heat sink where the variable thermal resistance is one or more capillary tubes;

These and other embodiments are further described in the detailed description that follows.

DETAILED DESCRIPTION

The following description sets forth many different alternative embodiments of variable thermal resistance elements. Variable thermal resistance, as used herein, is a varying resistance to heat transfer either by conduction or convection. The variation in thermal resistance is controllable in the systems and methods described herein. The control of the thermal resistance allows better control of unwanted heat dissipation and therefore provides DUT heat control with greater efficiency and greater accuracy than in prior systems and methods. In the accompanying drawings, elements performing a similar function in the illustrated embodiment carry the same reference number to understand the differences among the many illustrated embodiments.

Figure 1:
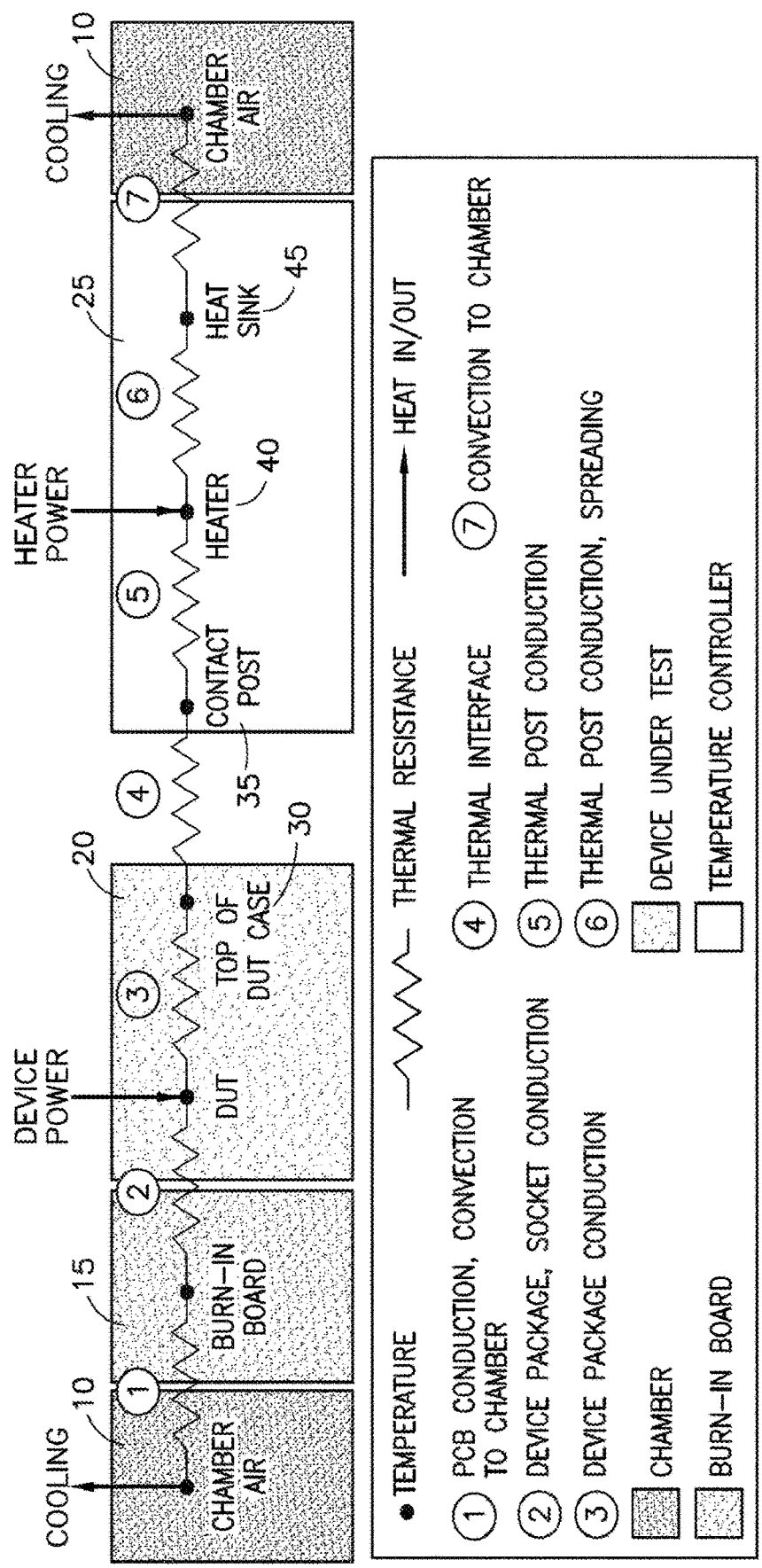
FIG. 1 is a thermal illustration of a burn-in board, DUT and temperature controller.

A network representation of the thermal system of chamber, burn-in-board, device under test, and temperature controller is illustrated in FIG. 1. FIG. 1 illustrates a thermal system having the conventional components of an air chamber 10 (Cham herein), a burn-in board (BIB herein) 15, a DUT 20; a temperature controller (TC) 25; and another air chamber 10. Heat flows from the thermal network out through the air chambers 10 on either end. The thermal resistances are found at (1) the conduction from the printed circuit board (PCB) of the BIB 15 to the adjacent air chamber 10. The thermal resistance in this instance is a heat convection resistance since the heat transfer medium is a gas. Another thermal resistance (2) is provided by heat conduction from the device package to a socket (not shown) in the BIB 15. Another thermal resistance (3) is heat conduction through the DUT package. Yet another thermal resistance (4) is the conduction resistance at the interface of the top of the DUT case 30 and the TC 25. Yet another thermal resistance is the resistance between the contact post 35 and the heater 40. Yet another thermal resistance (6) is the resistance between the heater 40 and the heat sink 45. Yet another thermal resistance (7) is the resistance between the heat sink 45 and the adjacent air chamber 10. Again, the thermal resistance (7) is a heat convection resistance.

Figure 2:
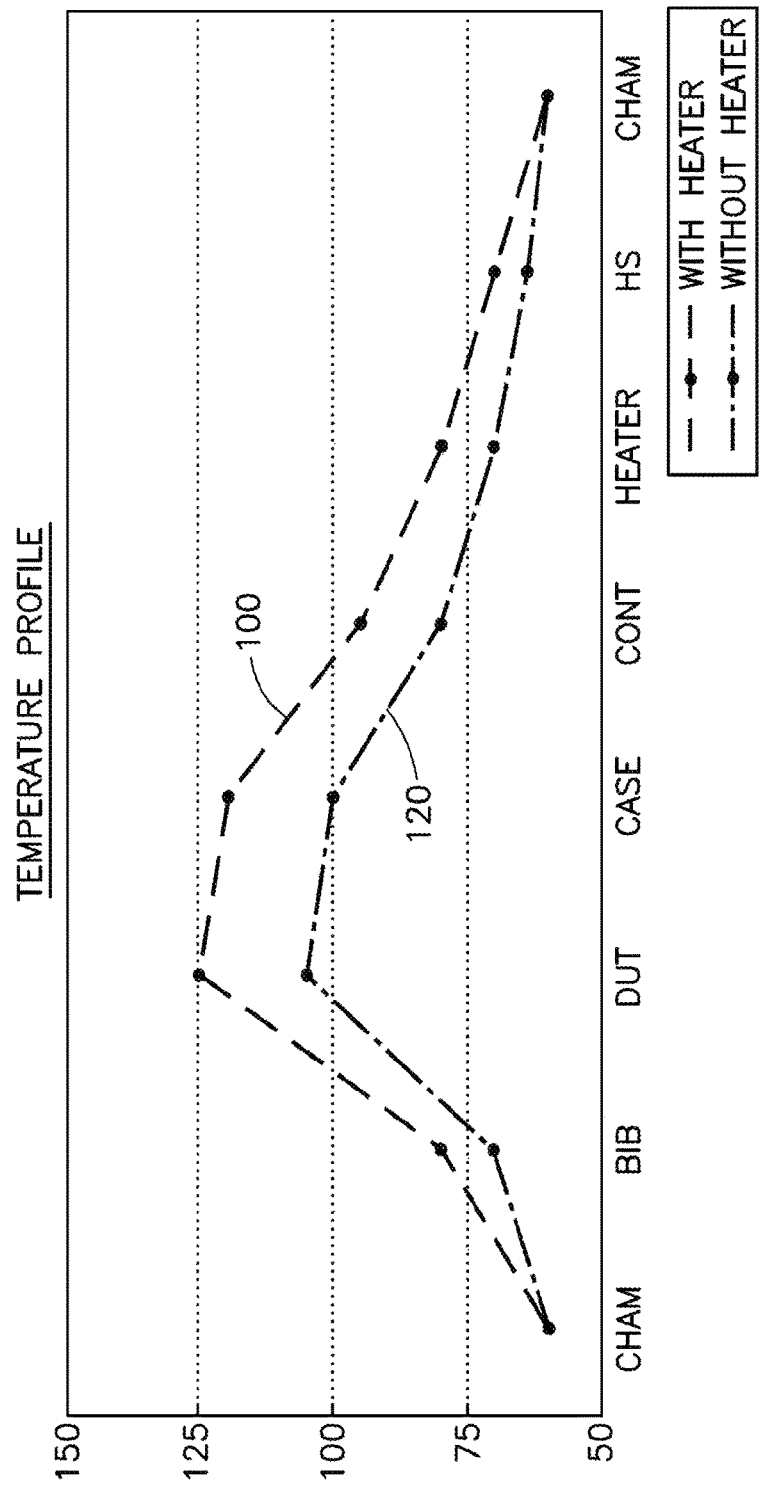
FIG. 2 illustrates a temperature profile of the various components in a burn-in system represented in FIG. 1.

FIG. 2 illustrates a representative temperature profile for the conventional approach comparing: i) the temperature profile when the heater is on (profile 100) and the heater is controlling the DUT temperature to a target 125° C.; and ii) the temperature profile when the heater is off (profile 120). The profile illustrates how the temperature changes along the path of thermal conduction described in FIG. 1 (i.e. from the chamber to the BIB, to the DUT, etc.). In profile 120 it can be seen that the DUT temperature has deviated significantly from the target due to excess cooling. The slope of the curve indicates the temperature at the various system temperature nodes due to the amount of heat flowing and the thermal resistance between the temperature nodes.

Referring again to FIG. 1, to raise the temperature of the DUT, heat is added by the heater 40. The additional heat increases the slope of the line from Heat Sink (HS) 45 to Chamber (Cham) 10. The increased slope from "HS" to "Cham" in FIG. 2 can be observed for profile 100 compared with profile 120 can be observed in FIG. 2. Since this thermal resistance is fixed in the FIG. 1 system, the steeper slope indicates that, to keep the DUT 20 at the target temperature, more heat is transferred into the chamber 10. This is the supplemental power required for temperature control in the conventional system illustrated in FIG. 1.

Figure 3:
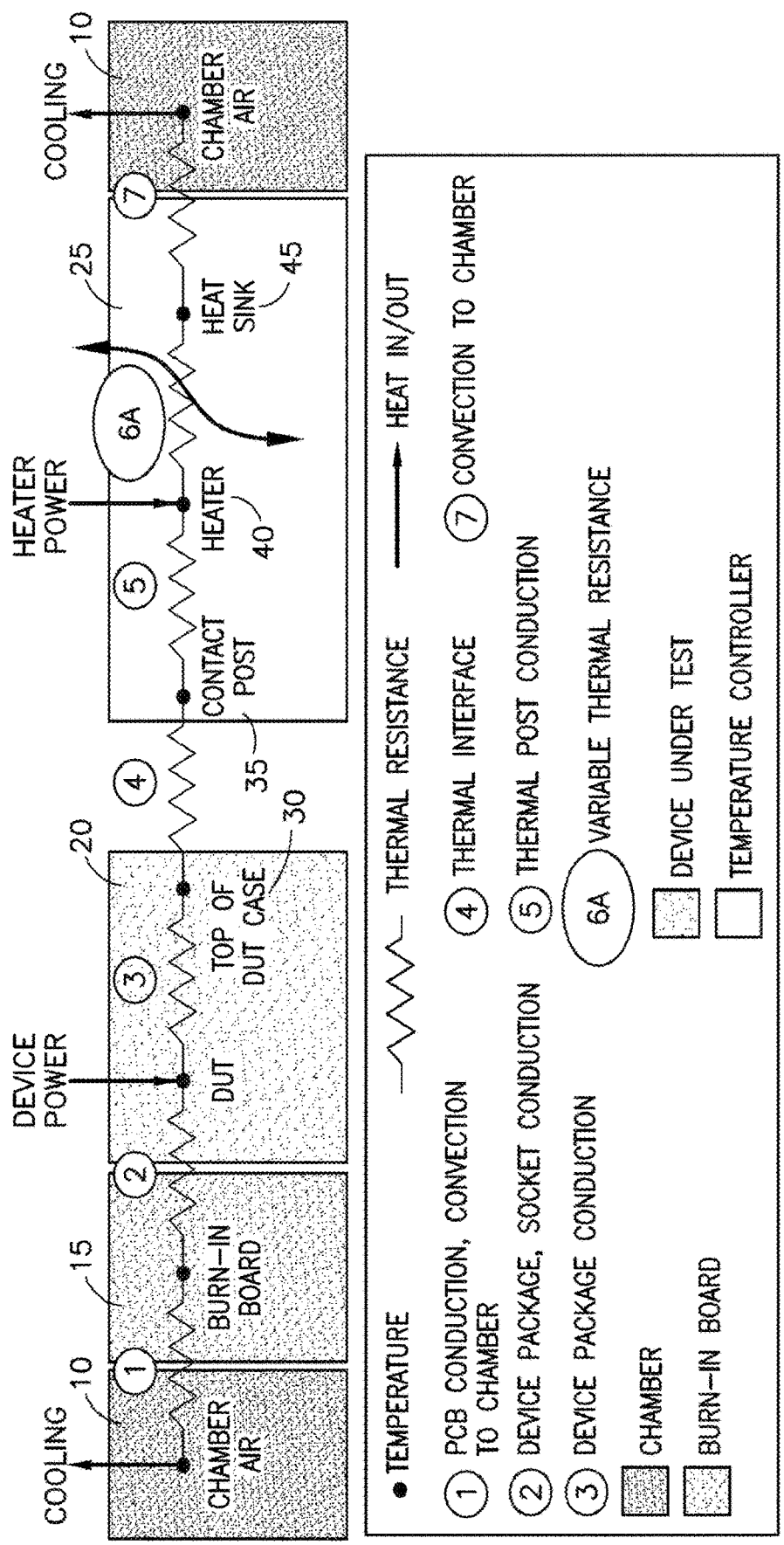
FIG. 3 illustrates an embodiment of the invention described herein, in which the temperature controller includes a variable thermal resistance.

FIG. 3 illustrates a modification to the network representation in FIG. 1 that schematically represents a system that introduces a variable thermal resistance into the thermal network of the system. As in FIG. 1, FIG. 3 illustrates a thermal system having the conventional components of an air chamber 10 (also "Cham" herein), a burn-in board ("BIB" herein) 15, a DUT 20; a temperature controller (also "TC" herein) 25 and another air chamber 10. Heat flows from the thermal network out through the air chambers 10 on either end. The thermal resistances are provided at (1) the conduction from the printed circuit board (PCB) of the BIB 15 to the adjacent air chamber 10. The heat transfer through the air chamber 10 is by convection, so the thermal resistance in this instance is a resistance to convection. Another thermal resistance (2) is provided by heat conduction from the device package to a socket (not shown) in the BIB 15. Another thermal resistance (3) is heat conduction through the DUT package. Yet another thermal resistance (4) is the conduction resistance at the interface of the top of the DUT case 30 and the TC 25. Yet another thermal resistance is the resistance between the contact post 35 and the heater 40. As a modification to the thermal network illustration in FIG. 1, the thermal resistance (6A) is a variable thermal resistance between the heater 40 and the heat sink 45. Yet another thermal resistance (7) is the resistance between the heat sink 45 and the adjacent air chamber 10.

Figure 4:
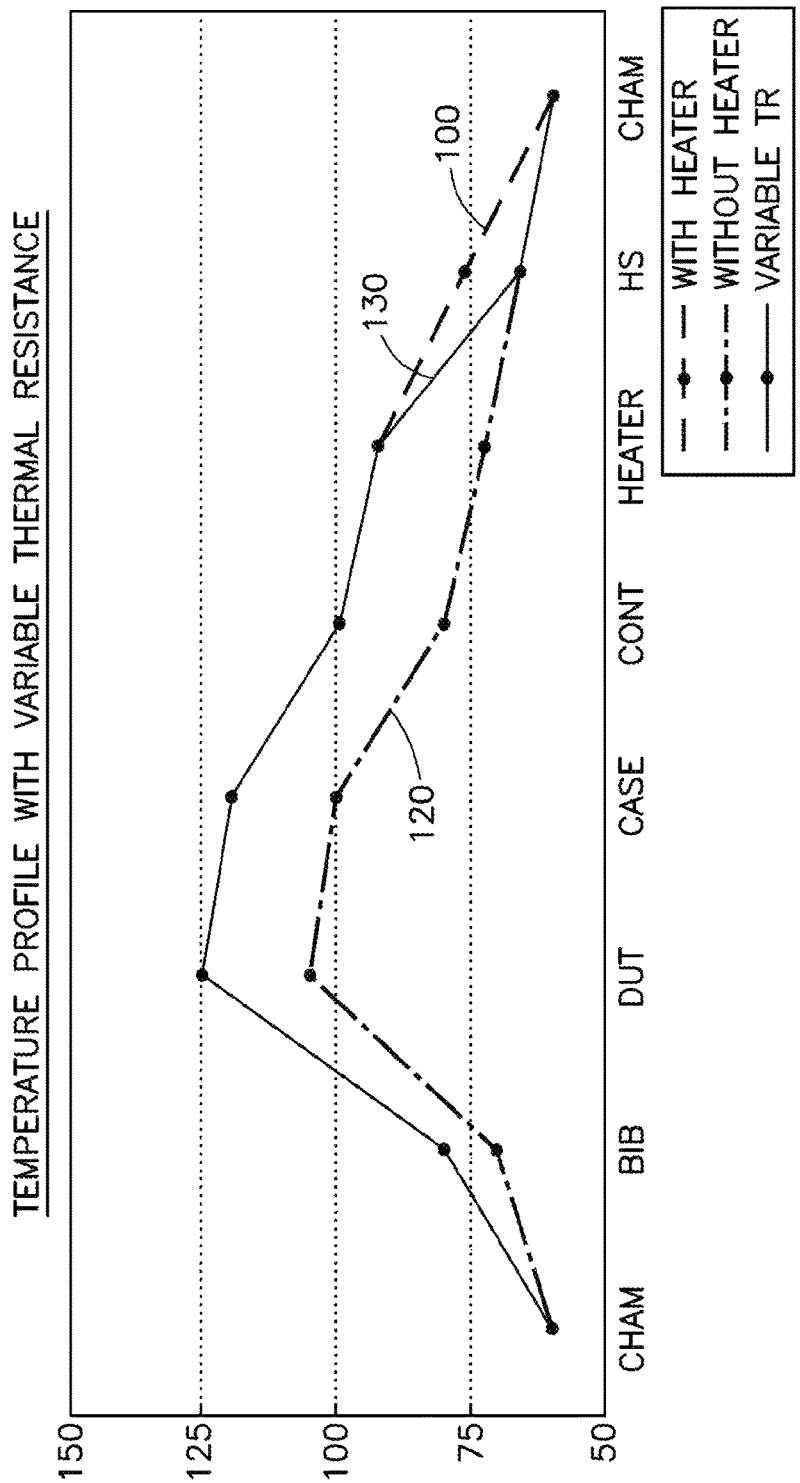
FIG. 4 illustrates a temperature profile of the various components in a burn-in system represented in FIG. 3 having a variable thermal resistance.

FIG. 4 illustrates a change in the temperature profile illustrated in FIG. 2 as a result of the introduction of the variable thermal resistance 6A illustrated in the thermal network in FIG. 3. FIG. 3 illustrates three different temperature profiles. One profile 100 is when the heater is on and controlling the DUT to 125° C. Another profile 120 is when the heater is off and the DUT temperature has deviated significantly from the target due to excess cooling. The third profile 130 achieves the target DUT temperature while decreasing the slope of the curve that indicates the amount of heat lost to ambient. The variable thermal resistance can be modulated to accommodate higher or lower device power dissipation to provide dynamic control. Because of this, supplemental heating that is required for the approach in FIG. 1 can be reduced or eliminated altogether when variable thermal resistance is used.

Described here are different methods and designs for introducing a variable thermal resistance into the thermal network illustrated in FIG. 3. The variable thermal resistance can be achieved using three different design approaches. The first approach is contact area variation. In contact variation, thermal resistance in thermal conduction is proportional to 1/A where A represents a characteristic cross-sectional area in the direction of heat flow for a given conducting element. As A increases, the thermal resistance reduces. The cross-sectional area can be varied on a macro scale by changing the shape of a conducting element (illustrated in FIGS. 5, 6 and 7) or by changing the contact area between two surfaces in the heat conduction path (illustrated in FIGS. 8, 9, 11, 12, 13, and 14).

Figure 6:
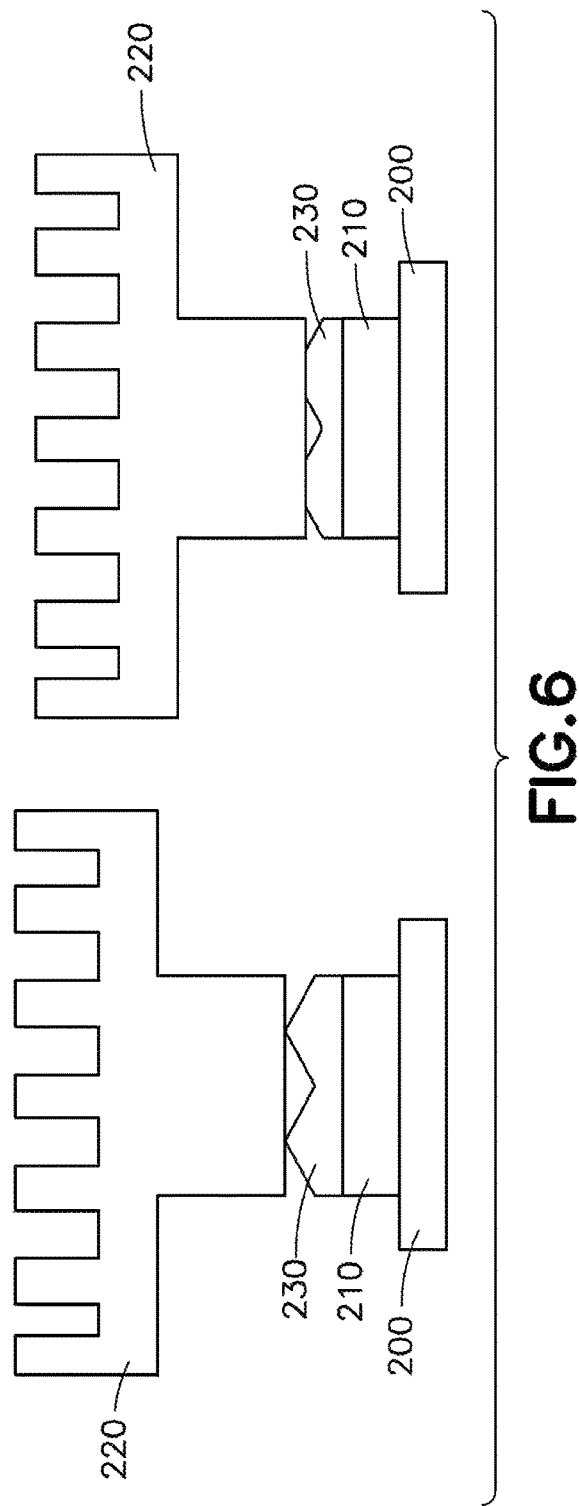
FIG. 6 illustrates one embodiment having a moveable heat sink where the variable thermal resistance is a shaped elastomer.
Figure 7:
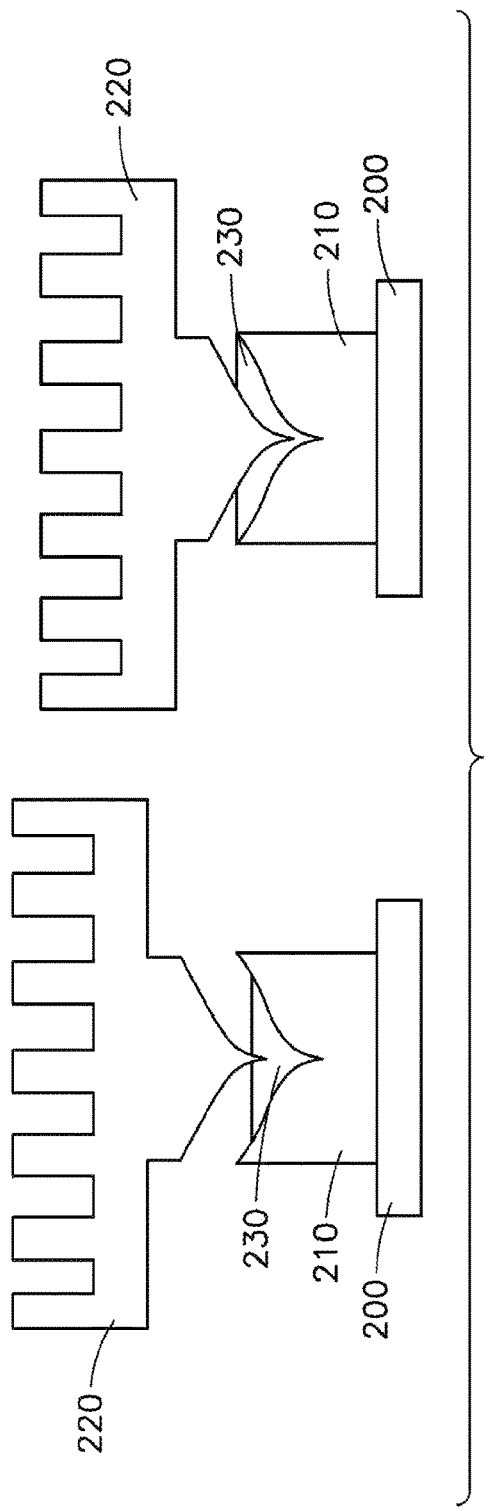
FIG. 7 illustrates one embodiment having a moveable heat sink and a DUT contact with a contoured geometry where the variable thermal resistance is a liquid conductor.

Another approach is variation in conductor length. In this approach, thermal resistance in conduction is proportional to the length of the element in the direction of heat flow. As the length increases, the thermal resistance increases. Designs that provide variable length conductors are illustrated in FIGS. 5, 6 and 7.

A third approach is referred to herein as active enhancement of the heat transport either by conduction or convection. Actively-controlled elements that can affect the transport of heat either by conduction or convection to modulate the thermal resistance are illustrated in FIGS. 10, 15, 16 and 17.

The designs described herein differ radically from conventional mechanisms for modulating the cooling of a heat sink using dampers or fans to control the air-flow through the heat sink.

Figure 5:
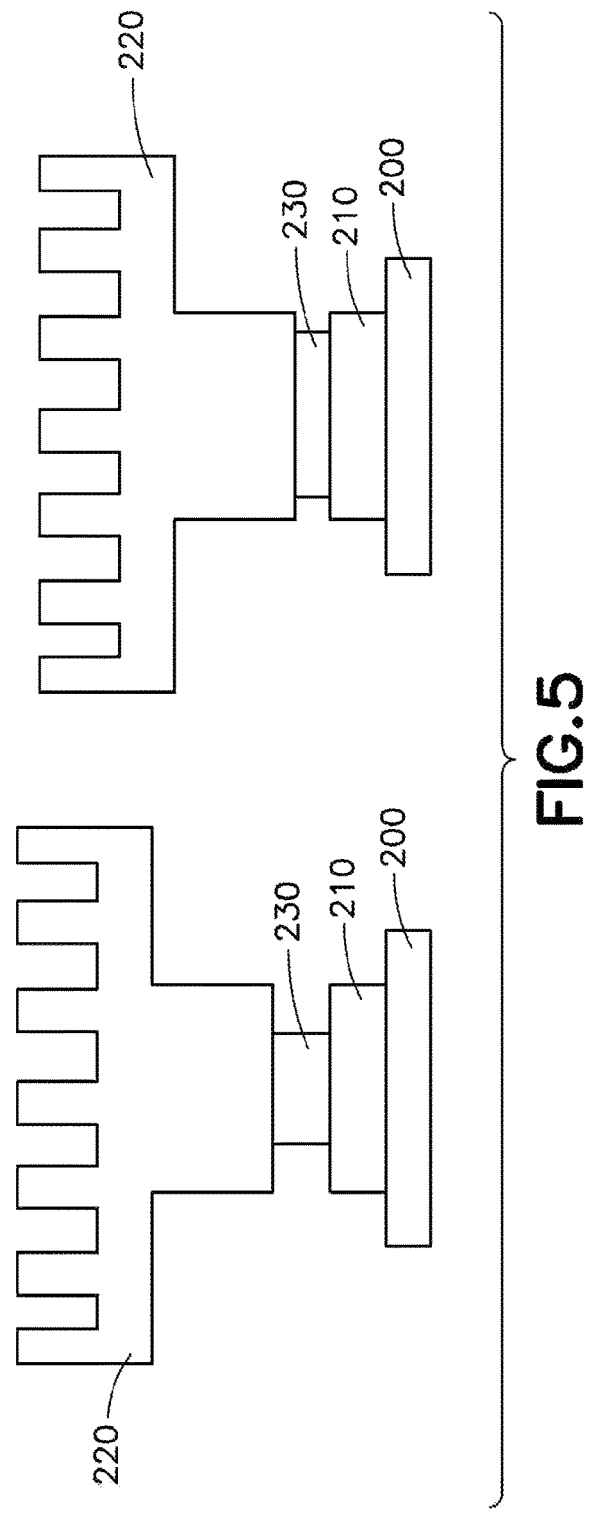
FIG. 5 illustrates one embodiment having a moveable heat sink where the variable thermal resistance is a liquid conductor.

Referring to FIG. 5, an individual DUT 200 is illustrated in thermal communication with a contact element 210 which is in thermal communication with a heat sink 220. Interposed between the heat sink 220 and the contact element 210 is a liquid heat conductor material 230 such as gallium or a phase-change thermal interface material. Phase change thermal interface materials are commonly used in electronic devices. Such materials are solid pads at room temperature. At temperatures above their transition temperature, they begin to soften and flow, filling the microscopic irregularities of the components in contact with the material. The result is an interface with minimal thermal contact resistance. As illustrated in FIG. 5, by moving the heat sink 220 up and down relative to the DUT contact 210, the surface area and length of the liquid conducting element 230 changes. For a fixed volume of conducting liquid in the variable element 230, the thermal resistance is proportional to the distance squared between the heat sink 220 and the contact element 210.

Referring to FIG. 6, an individual DUT 200 is illustrated in thermal communication with a contact element 210 which is in thermal communication with a heat sink 220. Interposed between the heat sink 220 and the contact element 210 is a shaped elastomer conductor material 230 such as impregnated silicone. As illustrated in FIG. 6, by moving the heat sink 220 up and down relative to the DUT contact 210, the contact area and conductor length of the shaped elastomer conductor material 230 changes. As the shaped elastomer conductor material is compressed by the advancing heat sink 220, the thermal conductance between the heat sink 220 and the contact element 210 increases.

Referring to FIG. 7, an individual DUT 200 is illustrated in thermal communication with a contact element 210 which is in thermal communication with a heat sink 220. Interposed between the heat sink 220 and the contact element 210 is a liquid conducting element 230 such as gallium or a phase-change thermal interface material described with reference to FIG. 5 above. As illustrated in FIG. 7, by moving the heat sink 220 up and down relative to the DUT contact 210, the surface area and length of the liquid conducting element 230 varies. Because of the contour on the contact element 210 and the heat sink 220, the relationship between thermal resistance and the relative position of 210 and 220 can be tailored to achieve the desired thermal conductance/resistance that will provide the target temperature control. Note that the contours of elements 210 and 220 are complementary as illustrated in FIG. 7. This is not required, and extent of contour and the match of the contours is largely a matter of design choice. It is noted however, that more efficient heat conductance can be achieved with complementary contours as they permit the minimum distance between elements 210 and 230.

Figure 8:
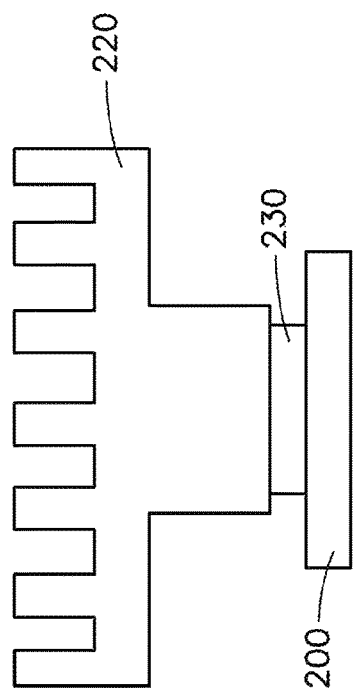
FIG. 8 illustrates one embodiment having a moveable heat sink where the variable thermal resistance is an elastomeric interface material.

Referring to FIG. 8, an individual DUT 200 is illustrated in thermal communication with a heat sink 220. Interposed between the heat sink 220 and the DUT 200 is an elastomeric thermal interface material (TIM). Such materials are described in the description of FIG. 6 above. As illustrated in FIG. 8, by moving the heat sink 220 up and down relative to the DUT 200, the conductor length of the elastomeric thermal interface material (TIM) 230 changes. As the elastomeric thermal interface material (TIM) 230 is compressed by the advancing heat sink 220, the thermal conductance between the heat sink 220 and the DUT increases. Due to microscopic imperfections in the contact surfaces of elements 200 and 220 and the heat conduction characteristics of commercially available TIM materials, varying the pressure between the heat sink 220 and the DUT 200 with an intervening TIM 230 will cause the interfacial thermal resistance to change. Because there is not intervening contact element in this embodiment, this variation is in the thermal resistance 4 in the thermal network illustrated in FIG. 3 above.

Figure 9:
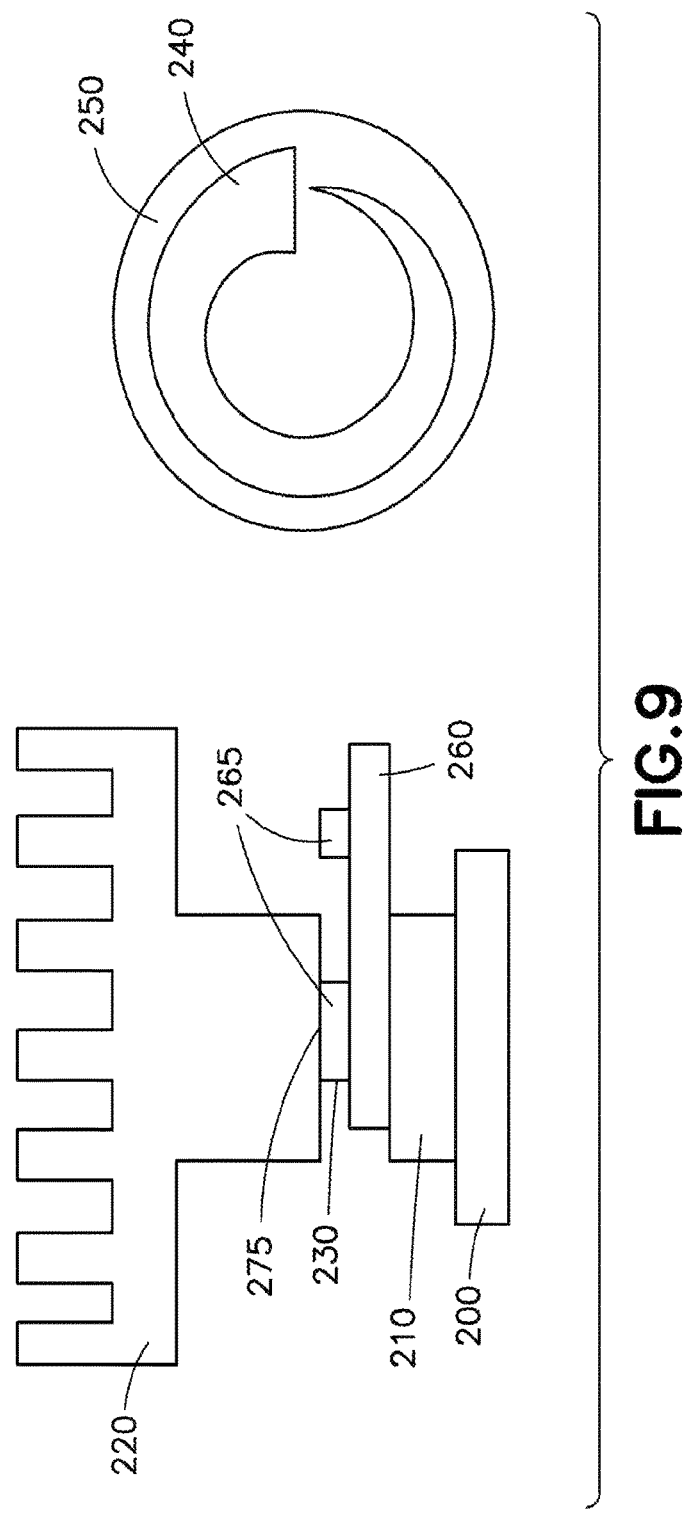
FIG. 9 illustrates one embodiment having a fixed heat sink where the variable thermal resistance is a moveable thermal conducting element with a variable contact area.

Referring to FIG. 9, the position of the heat sink 220 in relation to the contact 210 and DUT 200 is fixed in this embodiment. The arrangement in FIG. 9 has a moveable conductor element that can vary the contact area of the thermal conductor 240 in the variable thermal resistance element 230. Illustrated is a conductor element 240 of irregular dimensions. The movable variable thermal resistance element 230 is illustrated as a disk 250 that rotates or a bar 260 that slides that has a raised contact surface 265. When moved, the contact area 240, 265 between the heat sink 220 and the variable thermal conductor element 230 varies. Since this embodiment requires movement of the thermal conductor element while in contact with the thermal conductor element, it is advantageous if a lubricant 270 is placed between the contact 240, 265 and the heat sink 220. Lubricants that are also a good thermal interface material are contemplated. Such materials are well known to those skilled in the art and not described in detail herein.

Figure 10:
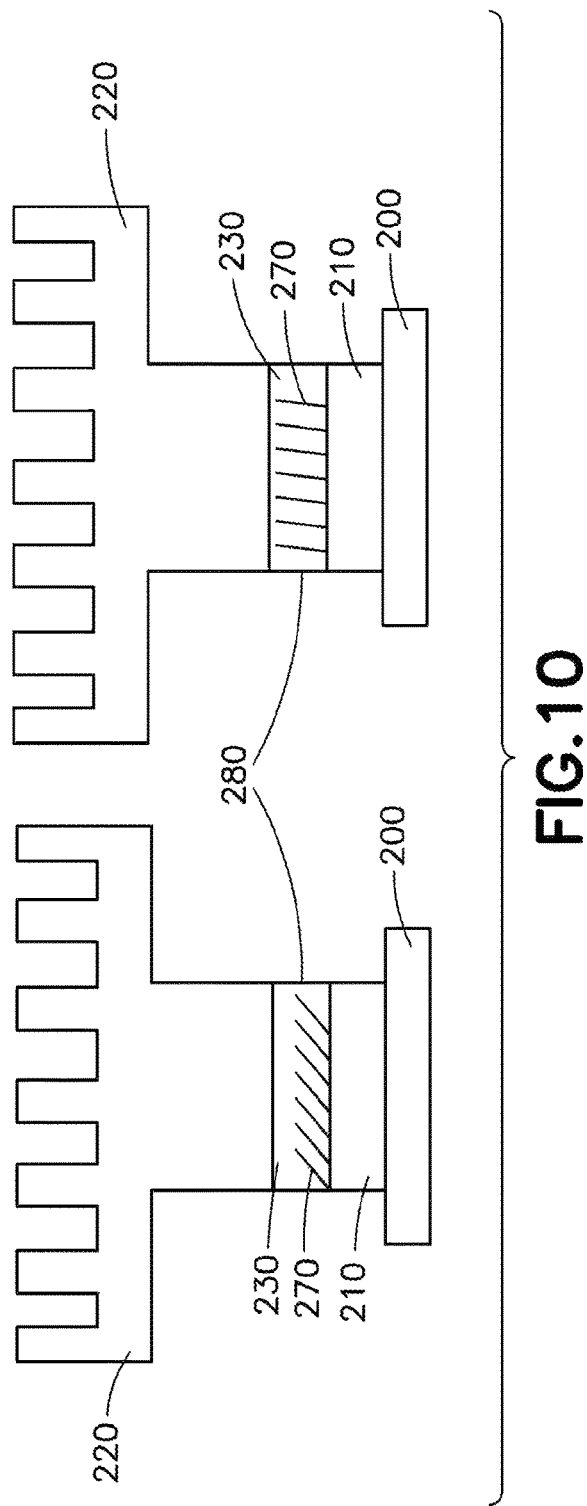
FIG. 10 illustrates one embodiment having a fixed heat sink where the variable thermal resistance is a liquid-containing element with movable conductors that vary the thermal conductance from the heat sink to the DUT.

Referring to the embodiment illustrated in FIG. 10, the position of the heat sink 220 relative to the contact 210 and DUT 200 is fixed in this embodiment. The variable thermal resistance element 230 in this embodiment is a liquid filled element. The outside portion of the variable thermal resistance element is a material that can contain the liquid-filled interior and can itself conduct heat therethrough. Examples of such materials are well known to those skilled in the art and are not described in detail herein. The liquid 280 the variable thermal resistance element 230 is a fluid with a high boiling point (e.g., about 25° C. to about 150° C.) and moderate to low thermal conductivity (e.g. an oil; about 0.1 watt/meter ° K to about 0.2 watt/meter ° K).

The conductors 270 in the variable thermal resistance element 230 are illustrated as rods or fibers 270 that have very high thermal conductivity. The rods 270 are aligned by the application of a field or force thereto. Such fields or force can be a magnetic field, bimetallic strip, mechanical actuation or various other means. When the conducting rods 270 have a significantly horizontal aspect, the thermal resistance of the variable thermal resistance element 230 will be higher. When the conducting rods have a significantly vertical aspect the thermal resistance of the variable thermal resistance element is lower.

Referring to the embodiment illustrated in FIG. 11, the position of the heat sink 220 in relation to the contact 210 and DUT 200 is fixed in this embodiment. The variable thermal resistance element in this embodiment is one or more capillary tubes 290 the have sections filled with conducting liquid 295. Examples of suitable thermal conducting liquids include gallium, water, brine, etc. The capillary tubes include two pockets of gas 297, 298. Pocket 297 is in a closed end of the capillary tube structure 290. Pocket 298 is connected to a pressure or vacuum regulator (not shown). By varying the pressure in pocket 298, the size of pocket 297 increases or decreases moving the liquid conductor 295 into and out of the heat conducting path between the DUT contact 201 and the capillary tube. The more liquid 295 in the conductive pathway from the heat sink 220 to the contact 210, the greater the amount of thermal conductance in the conductive pathway form the heat sink 220 to the DUT 200 (and vice-versa).

Figure 12:
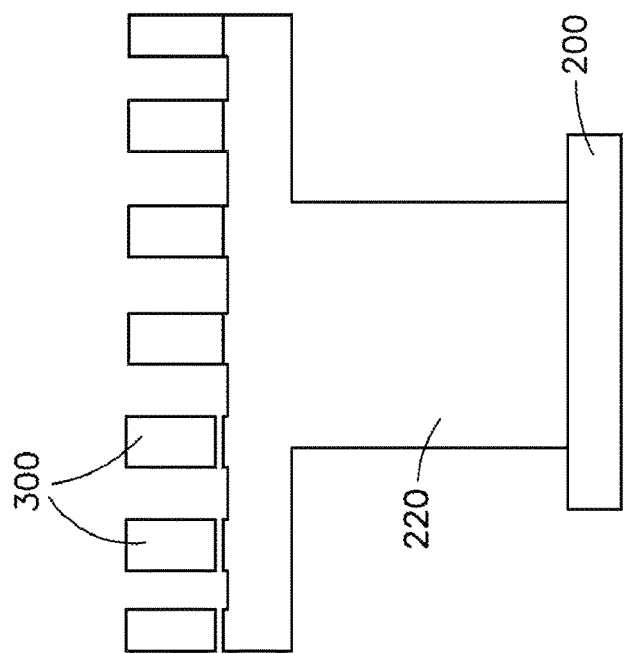
FIG. 12 illustrates one embodiment having where the variable thermal resistance is a heat sink with removeable/adjustable fins.

Referring to the embodiment illustrated in FIG. 12, a heat sink 220 with removeable fins 300 is illustrated. In this embodiment, the removable fins 300 of the heat sink 220 makes the heat sink itself the variable thermal resistance element. The more fins 300 on the heat sink 200 the greater the thermal conductivity of the heat sink element 220. The fins can be attached/detached to the heat sink using a variety of mechanisms. Mechanisms for attaching and detaching heat sink fins changes thermal conductivity to fins include magnetic attachment, piezo electric attachment, solenoid actuators for moving the fins up and down and adjusting the contact force between the adjustable/removable fin 300 and the heat sink 220. Automated mechanisms for moving fins into contact with and out of contact from the heat sink are contemplated. Such mechanisms are well known to those skilled in the art and are not described in detail herein.

Figure 13:
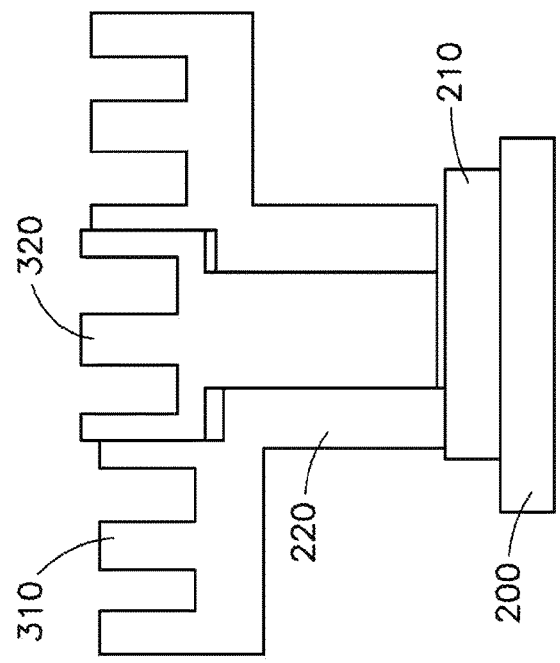
FIG. 13 illustrates one embodiment having where the variable thermal resistance is a sectioned heat sink.

Referring to the embodiment illustrated in FIG. 13, the heat sink 220 is divided into a plurality of sections (310 and 320). In this embodiment, the DUT contact element 210 is disposed between the DUT and the heat sink. The sections 310 and 320 are moved independently into and away from contact with the DUT contactor. Again, in this embodiment, the heat sink is the variable thermal resistance element. The heat sink sections 310 and 320 can be positioned using a mechanical actuator such as a piezoelectric actuator. In another embodiment, the position of sections 310 and 320 are adjusted according to a pulse-width-modulated duty cycle with high enough frequency that the temperature ripple for each adjustment is vanishingly small for greater resolution. In this context, a 'vanishingly small' ripple addresses the "ripple" in temperature causes by the heat sink being placed in contact with, and removed from contact with, the DUT contact. When the heat sink is in physical contact with the DUT or its contact, the DUT temperature decreases and when the heat sink is removed from contact with the DUT or its contact, the DUT temperature increases. If the frequency of this "on-off" cycle is increased, then the "ripple" that occurs will be negligible or unnoticeable.

Figure 14:
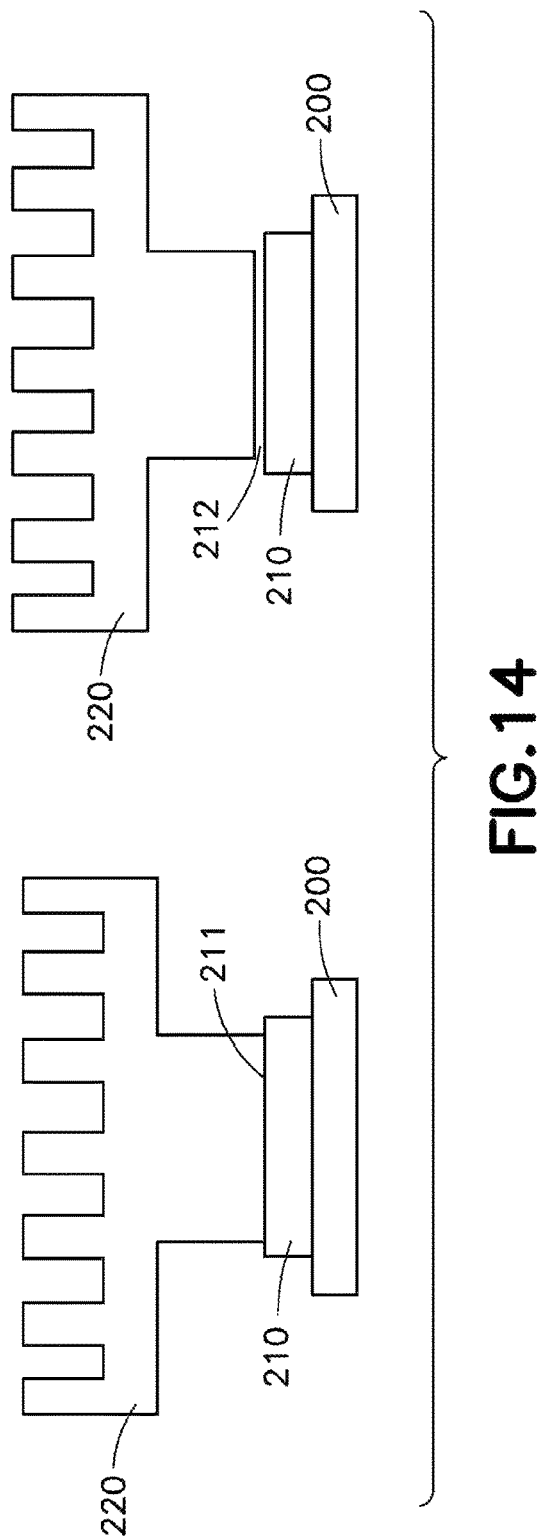
FIG. 14 illustrates one embodiment having where the variable thermal resistance is a moveable heat sink.

Referring to the embodiment illustrated in FIG. 14, the heat sink 220 can be advanced into contact 211 with the DUT contact 210 or moved from contact with 212 the DUT contact 210. The mechanism for advancing or withdrawing the heat sink 220 can be a mechanical actuator, such as a piezoelectric mechanism. The motion of the heat sink 220 is controlled by a motor using a follow pulse-width-modulated duty cycle with high enough frequency that the temperature ripple for each adjustment of the heat sink position is vanishingly small. In this context, a 'vanishingly small' ripple addresses the "ripple" in temperature causes by the heat sink being placed in contact with, and removed from contact with, the DUT contact. When the heat sink is in physical contact with the DUT or its contact, the DUT temperature decreases and when the heat sink is removed from contact with the DUT or its contact, the DUT temperature increases. If the frequency of this "on-off" cycle is increased, then the "ripple" that occurs will be negligible or unnoticeable.

Figure 15:
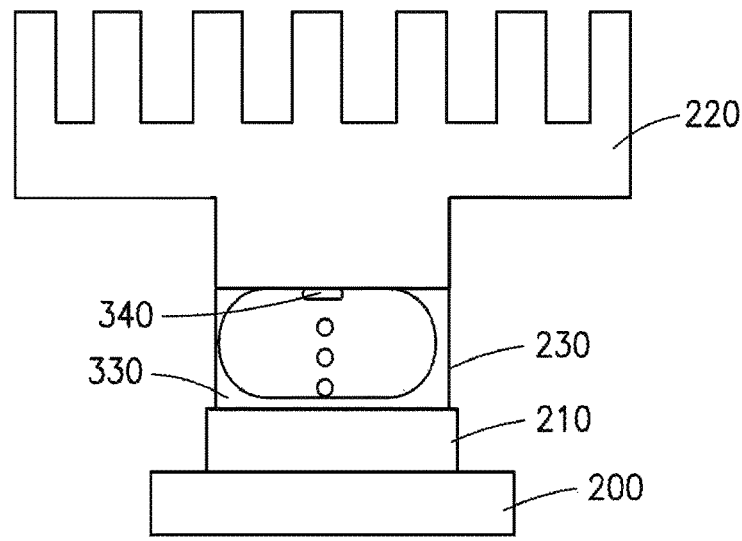
FIG. 15 illustrates one embodiment having where the variable thermal resistance is provided by spraying a heat conductive liquid on the bottom surface of the heat sink where the thermal resistance varies as the liquid flows back down from the lower surface of the heat sink on which it was sprayed.

Referring to the embodiment illustrated in FIG. 15, the variable thermal resistance element 230 is a chamber that contains a mechanism that sprays liquid (droplets or stream) to the surface of 230 in contact with the heat sink 220. The spray is distributed between the heat sink 220 and the DUT contact element 210. The volume of the stream affects the heat conductance resistance between the heat sink 220 and the DUT contact element 210. The spray of liquid is provided by an actuator (e.g. ultrasonic piezoelectric) somewhere near the bottom of the variable thermal resistance element 230 and is directed toward the bottom surface of the heat sink 220. The heated liquid that contacts the bottom surface of the heat sink 220 transfers heat to the heat sink and then the cooled liquid removes additional heat from the DUT contact 210. The rate of heat transfer is related to the rate at which the liquid flows from the top of the contact 210 to the bottom of the heat sink 220. Therefore, the heat conductance is varied by the rate at which the liquid is moved from the surface 330 of 230 in contact with the contact element 210 to the surface 340 in contact with the heat sink 220.

Figure 16B:
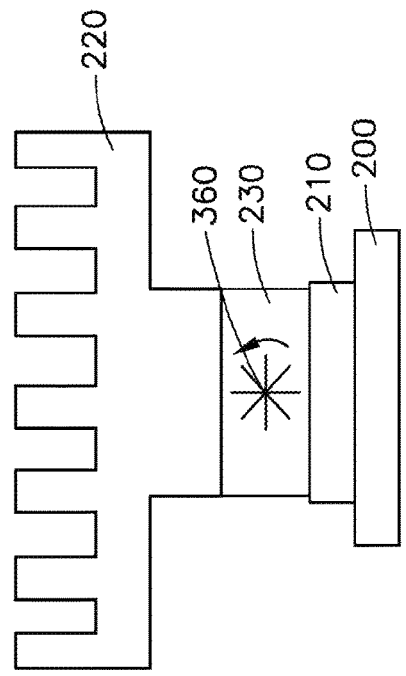
FIG. 16B illustrates one embodiment having where the variable thermal resistance is provided by a heat exchanger that is a mixing chamber with circulating liquid.
Figure 16A:
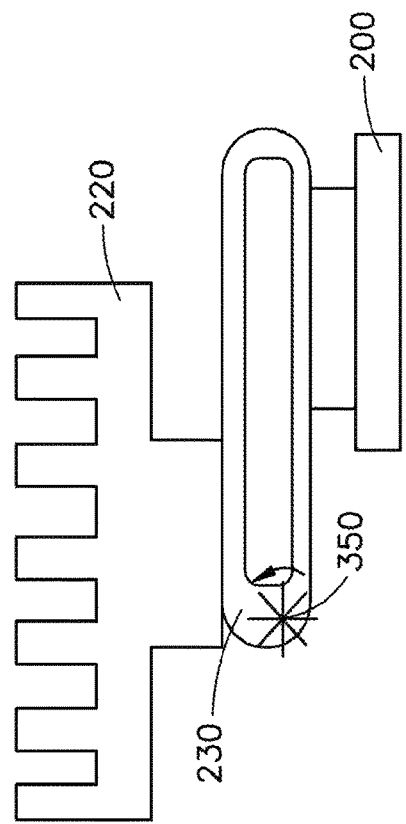
FIG. 16A illustrates one embodiment having where the variable thermal resistance is provided by a heat exchanger that is a loop filled with circulating liquid.

Referring to the embodiment illustrated in FIG. 16A, the variable thermal resistance element 230 is a closed fluid loop filled with liquid in a relatively low thermal conductivity conduit thermally connected between the heat sink 220 and the DUT contact element 210. A pump 350 force the liquid to flow through the loop at varying rate to vary the thermal resistance between the heat sink 220 and the contact element 210. An alternative embodiment illustrated in FIG. 16B has a variable thermal resistance element 230 that is a mixing chamber interposed between heat sink 220 and DUT contact 210. The variable thermal resistance element has an agitating element 360 that circulates the fluid for heat transfer from heat sink 220 to DUT contact element 210. Examples of suitable liquids include water or any liquid suitable for such heat transfer applications. Such liquids are well known to one skilled in the art and not described in detail herein.

Figure 17:
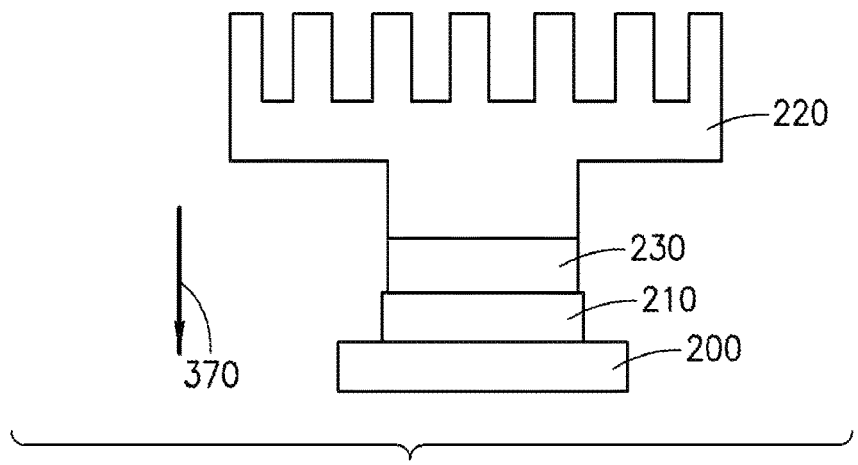
FIG. 17 illustrates one embodiment having where the variable thermal resistance is provided by a thermal electric element.

Referring to the embodiment illustrated in FIG. 17, the variable thermal resistance element 230 is a thermoelectric element. When the thermoelectric element is turned off, the variable thermal resistance element 230 is simply a conductor. When the thermoelectric element that is the variable thermal resistance element 230 is powered in reverse, the variable thermal resistance element reduces the temperature of the heat sink 220 and raises the temperature of the DUT contact 210. This is illustrated by arrow 370 which shows heat flowing from the heat sink 220 to the DUT contact 210. When the thermoelectric element that is the variable thermal resistance element 230 is powered in forward, the variable thermal resistance element 230 increases the temperature of the heat sink 220 and reduces the temperature of the DUT 200 by drawing heat from the DUT contact 210. The power required to operate the thermoelectric element as the variable thermal resistance element 230 adds to the total power dissipated in the chamber. Therefore, the nominal thermal resistance of the unpowered thermoelectric element is selected to approximately equal to the amount of thermal resistance that is required for the DUT to reach target temperature (which is based on the other fixed thermal resistances in the system.

In an embodiment in which the variable thermal resistance element is a fixed set of thermoelectric elements, the tuning of each individual thermoelectric element is accomplished by selecting a chamber air temperature such that the number of individual thermoelectric elements operating in the forward setting is approximately equal to the number of thermoelectric elements operating in reverse. Typically, there is one thermoelectric element per DUT. However, the DUTs and the thermal electric elements can be concatenated with each other to achieve a desired temperature gradient. The operation of the thermoelectric elements in this manner depends on the individual DUT and any variance in thermal conductance between the DUT 200 and the DUT contact 210. In one embodiment the thermoelectric element uses the Peltier effect to create a heat flux between the junction of two different types of materials in the network representation of the thermal system of chamber illustrated in FIG. 3. A Peltier cooler, heater, or thermoelectric heat pump is a solid-state active heat pump which transfers heat from one side of the device to the other, with consumption of electrical energy, depending on the direction of the current. Such devices are well known to those skilled in the art and are not described in detail herein.

In this specification, the word "comprising" is to be understood in its "open" sense, that is, in the sense of "including", and thus not limited to its "closed" sense, that is the sense of "consisting only of". A corresponding meaning is to be attributed to the corresponding words "comprise", "comprised" and "comprises" where they appear.

While particular embodiments of this technology have been described, it will be evident to those skilled in the art that the present technology may be embodied in other specific forms without departing from the essential characteristics thereof. The present embodiments and examples are therefore to be considered in all respects as illustrative and not restrictive. It will further be understood that any reference herein to subject matter known in the field does not, unless the contrary indication appears, constitute an admission that such subject matter is commonly known by those skilled in the art to which the present technology relates.

The invention claimed is:

1. A system comprising:
a thermal system comprising an air chamber in thermal communication with a burn-in board, wherein there is a thermal resistance between the air chamber and the burn-in board, the burn-in board comprising a socket in which to receive a device under test;
a device package disposed in the socket comprising an electronic device, the electronic device disposed in the device package, wherein there is a thermal resistance between the device package and the burn-in board; and
a temperature controller comprising a heater and a heat sink, the temperature controller in thermally connected to the device package, wherein there is a first thermal resistance between the temperature controller and the device package and a thermal resistance between the heater and the heat sink, wherein the thermal resistance between the heater and the heat sink is a variable thermal resistance and wherein the temperature controller is also in thermal communication with the air chamber, wherein there is a thermal resistance between the temperature controller and the air chamber.

2. The system of claim 1 wherein the variable thermal resistance allows the thermal resistance between the heater and the heat sink to be varied.

3. The system of claim 2 wherein the variable thermal resistance is placed between opposing surfaces of the heat sink and a contact element on the device package and the variable thermal resistance is provided by a variable resistance material selected from the group consisting of a gallium material or a phase change material.

4. The system of claim 3 wherein the phase change material is a solid at room temperature and softens and flows at or above a transition temperature that is above room temperature.

5. The system of claim 3 wherein a distance between the heat sink and the contact element on the device package is variable, and a surface area and length of the variable resistance material changes as the distance between the heat sink and the device package changes.

6. The system of claim 5 wherein at least one of the opposing surfaces of the heat sink and the contact element is a contoured surface such that the distance between the opposing surfaces of the heat sink and the contact element is varied due to the contoured surface.

7. The system of claim 6 wherein both opposing surface are contoured and both contours are complementary to each other.

8. The system of claim 2 wherein the variable thermal resistance is placed between the heat sink and a contact element on the device package and the variable thermal resistance is provided by a variable resistance material that is a shaped conductive elastomer material.

9. The system of claim 8 wherein the variable resistance material is impregnated silicone.

10. The system of claim 8 wherein a distance between the heat sink and the device package is variable, and a surface area and length of the variable resistance material changes as the distance between the heat sink and the device package changes.

11. The system of claim 2 wherein the variable thermal resistance is placed between the heat sink and a contact element on the device package and the variable thermal resistance is provided by a moveable conductor element.

12. The system of claim 11 wherein the moveable conductor element varies a thermal contact area between the heat sink and the contact element has at least two raised contact surfaces, wherein a surface area of a first raised contact surface is different than a surface area of a second raised contact surface and the moveable conductor element has a first position wherein the first raised contact surface is interposed between the heat sink and the contact element and a second position wherein the second raised contact surface is interposed between the heat sink and the contact element.

13. The system of claim 11 wherein the moveable conductor element has a conductor element with variable dimensions and the moveable conductor element varies the thermal resistance by moving the moveable conductor element to adjust an amount of surface area of the conductor element in contact with the heat sink and the conductor element.

14. The system of claim 2 wherein the variable thermal resistance is placed between opposing surfaces of the heat sink and a contact element on the device package and the variable thermal resistance is provided by a liquid material, wherein the liquid material is retained in a thermally conductive container.

15. The system of claim 14 wherein a boiling point of the liquid material is about 25° C. to about 150° C. and a thermal conductivity of the liquid material is about 0.1 watt/meter ° K to about 0.2 watt/meter ° K.

16. The system of claim 15 wherein the liquid material has conductive rods disposed therein.

17. The system of claim 2 wherein the variable thermal resistance is placed between opposing surfaces of the heat sink and a contact element on the device package and the variable thermal resistance is provided by a sectioned variable thermal resistance comprising at least two sections, a gas section a liquid section, wherein adjusting a pressure in the gas section moves more or less of the a liquid in the liquid section into a thermally conductive path between the heat sink and the contact element.

18. The system of claim 2 wherein the variable thermal resistance is the heat sink having a variable number of fins or sections such that a surface area of the heat sink is adjustable.

19. The system of claim 2 wherein the variable thermal resistance is provided by an adjustable distance between opposing surfaces of the heat sink and a contact element on the device package.

20. The system of claim 2 wherein the variable thermal resistance is provided by a container placed between opposing surfaces of the heat sink and a contact element on the device package, wherein the container receives a liquid spray, wherein a thermal conductivity between the contact element and the heat sink varies with a quantity and a temperature of the liquid.

21. The system of claim 2 wherein the variable thermal resistance is provided by a closed fluid loop placed between opposing surfaces of the heat sink and a contact element on the device package.

22. The system of claim 2 wherein the variable thermal resistance is provided by a thermoelectric element placed between opposing surfaces of the heat sink and a contact element on the device package.

* * * * *